(12) United States Patent
Chern et al.

(10) Patent No.: US 12,074,601 B2
(45) Date of Patent: *Aug. 27, 2024

(54) DYNAMIC HIGH VOLTAGE (HV) LEVEL SHIFTER WITH TEMPERATURE COMPENSATION FOR HIGH-SIDE GATE DRIVER

(71) Applicant: Taiwan Semiconductor Manufacturing Company, Ltd., Hsin-Chu (TW)

(72) Inventors: Chan-Hong Chern, Palo Alto, CA (US); Kun-Lung Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

This patent is subject to a terminal disclaimer.

(21) Appl. No.: 17/987,043

(22) Filed: Nov. 15, 2022

(65) Prior Publication Data

US 2023/0076455 A1    Mar. 9, 2023

Related U.S. Application Data

(63) Continuation of application No. 17/221,893, filed on Apr. 5, 2021, now Pat. No. 11,522,526, which is a (Continued)

(51) Int. Cl.
*H03K 3/011*    (2006.01)
*H03K 3/356*    (2006.01)

(52) U.S. Cl.
CPC ....... *H03K 3/011* (2013.01); *H03K 3/356017* (2013.01)

(58) Field of Classification Search
CPC .................. H03K 3/011; H03K 3/356017
(Continued)

(56) References Cited

U.S. PATENT DOCUMENTS 9,722,609 B2    8/2017   Kinzer et al.
10,630,285 B1   4/2020   Cuadra et al.
(Continued)

FOREIGN PATENT DOCUMENTS

CN    1512472 A      7/2004
JP    2009065229 A   3/2009

OTHER PUBLICATIONS

Texas Instruments. "UCC27714 High-Speed, 600-V High-Side Low-Side Gate Driver with 4-A Peak Output." SLUSBY6B, published Aug. 2015 & revised Mar. 2017.
(Continued)

*Primary Examiner* — William Hernandez
(74) *Attorney, Agent, or Firm* — Eschweiler & Potashnik, LLC

(57) ABSTRACT

Various embodiments of the present application are directed towards a level shifter with temperature compensation. In some embodiments, the level shifter comprises a transistor, a first resistor, and a second resistor. The first resistor is electrically coupled from a first source/drain of the transistor to a supply node, and the second resistor is electrically coupled from a second source/drain of the transistor to a reference node. Further, the first and second resistors have substantially the same temperature coefficients and comprise group III-V semiconductor material. By having both the first and second resistors, the output voltage of the level shifter is defined by the resistance ratio of the resistors. Further, since the first and second resistors have the same temperature coefficients, temperature induced changes in resistance is largely cancelled out in the ratio and the output voltage is less susceptible to temperature induced change than the first and second resistors individually.

20 Claims, 9 Drawing Sheets

Related U.S. Application Data continuation of application No. 16/693,596, filed on Nov. 25, 2019, now Pat. No. 11,005,453, which is a continuation of application No. 16/140,982, filed on Sep. 25, 2018, now Pat. No. 10,523,183.

(60) Provisional application No. 62/624,499, filed on Jan. 31, 2018.

(58) Field of Classification Search
USPC .......... 326/63, 68, 80, 82, 83; 327/108, 109, 327/333
See application file for complete search history.

(56) References Cited

U.S. PATENT DOCUMENTS

| | | |
|---|---|---|
| 2006/0186922 A1 | 8/2006 | Rozsypal |
| 2010/0164593 A1 | 7/2010 | Ha et al. |
| 2010/0214000 A1* | 8/2010 | Crespi ................. H03K 17/102 |
| | | 327/333 |
| 2011/0115541 A1* | 5/2011 | Barrow ............. H03K 19/0008 |
| | | 327/333 |
| 2011/0115542 A1* | 5/2011 | Koike ............ H03K 19/018521 |
| | | 327/333 |
| 2012/0081149 A1 | 4/2012 | Akahane |
| 2013/0181763 A1 | 7/2013 | Koike |
| 2014/0049293 A1 | 2/2014 | Mallikarjunaswamy |
| 2014/0062535 A1* | 3/2014 | Chen .................... H03K 17/223 |
| | | 327/78 |
| 2014/0320180 A1 | 10/2014 | Akahane |
| 2015/0062762 A1 | 3/2015 | Fujii |
| 2016/0056818 A1 | 2/2016 | Kanda et al. |
| 2016/0079785 A1* | 3/2016 | Kinzer ............. H01L 23/49575 |
| | | 320/107 |
| 2016/0079967 A1 | 3/2016 | Miwa |
| 2017/0092640 A1* | 3/2017 | Aoki ...................... H03F 1/301 |
| 2017/0110971 A1 | 4/2017 | Degen et al. |
| 2017/0155391 A1 | 6/2017 | Kinzer et al. |
| 2020/0044648 A1 | 2/2020 | Sharma et al. |

OTHER PUBLICATIONS

Non-Final Office Action dated Aug. 2, 2019 for U.S. Appl. No. 16/140,982.
Notice of Allowance dated Oct. 23, 2019 for U.S. Appl. No. 16/140,982.
Non-Final Office Action dated Oct. 6, 2020 for U.S. Appl. No. 16/693,596.
Notice of Allowance dated Jan. 14, 2021 for U.S. Appl. No. 16/693,596.
Non-Final Office Action dated May 10, 2022 for U.S. Appl. No. 17/221,893.
Notice of Allowance dated Aug. 10, 2022 for U.S. Appl. No. 17/221,893.

* cited by examiner ature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.
DYNAMIC HIGH VOLTAGE (HV) LEVEL SHIFTER WITH TEMPERATURE COMPENSATION FOR HIGH-SIDE GATE DRIVER

REFERENCE TO RELATED APPLICATIONS

This Application is a Continuation of U.S. application Ser. No. 17/221,893, filed on Apr. 5, 2021, which is a Continuation of U.S. application Ser. No. 16/693,596, filed on Nov. 25, 2019 (now U.S. Pat. No. 11,005,453, issued on May 11, 2021), which is a Continuation of U.S. application Ser. No. 16/140,982, filed on Sep. 25, 2018 (now U.S. Pat. No. 10,523,183, issued on Dec. 31, 2019), which claims the benefit of U.S. Provisional Application No. 62/624,499, filed on Jan. 31, 2018. The contents of the above-referenced Patent Applications are hereby incorporated by reference in their entirety.

BACKGROUND

Ultrahigh voltage semiconductor devices are semiconductor devices that can sustain operation at voltages of several hundred volts, such as, for example, voltages around 600 volts. Among other things, ultrahigh voltage semiconductor devices are used for level shifters. Such a level shifter translates an input signal at a first voltage domain to an output signal at a second voltage domain to resolve incompatibility between devices that respectively operate at the first and second voltage domains. Level shifters find application in, among other things, power conversion, radiofrequency (RF) power amplifiers, and RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
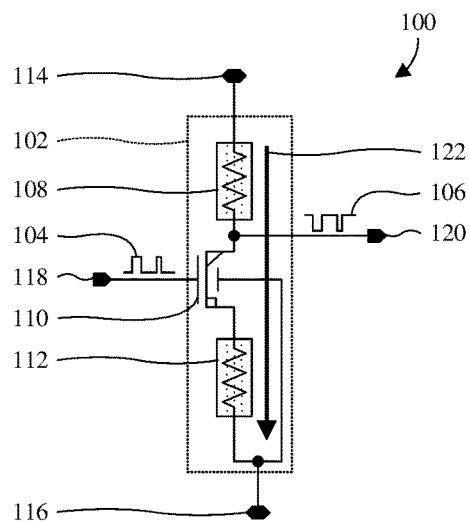
FIG. 1 illustrates a circuit diagram of some embodiments of a level shifter with temperature compensation.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high-voltage level shifter may comprise a p-type metal-oxide-semiconductor field-effect transistors (MOSFET) and an n-type MOSFET. The p-type and n-type MOSFETs are gated by an input signal in a first voltage domain and drains of the p-type and n-type MOSFETs are electrically coupled to each other at an output node. Further, a source of the n-type MOSFET is electrically coupled to a reference node (e.g., ground), and a source of the p-type MOSFET is electrically coupled to a power supply of a second voltage domain. Due to the configuration of the p-type and n-type MOSFETs, the p-type MOSFET is an ON state while the n-type MOSFET is in an OFF state and vice versa. Further, an output signal in the second voltage domain is generated at the output node. Depending upon which one of the n-type and p-type MOSFETs is in the ON state, the output signal is pulled down to the reference node or pulled up to the power supply. Challenges with the high-voltage level shifter are its large size and high parasitic gate capacitance, the latter of which limits performance (e.g., switching speed).

High-electron-mobility transistors (HEMTs) have smaller form factors and lower parasitic gate capacitances than the p-type and n-type MOSFETs. Therefore, an approach for overcoming the above challenges may be to replace the p-type and n-type MOSFETs respectively with p-type and n-type HEMTs. A p-type HEMT is a HEMT selectively conducting along a two-dimensional hole gas (2DHG), whereas an n-type HEMT is a HEMT selectively conducting along a two-dimensional electron gas (2DEG). However, a p-type HEMT is typically not suitable for use due to, among other things, low p-type (i.e., hole) mobility and the 2DHG band structure. Another approach for overcoming the above challenges may be to replace the p-type and n-type MOSFETs respectively with a resistor and an n-type HEMT. However, processes for forming the n-type HEMT are typically incompatible with processes for forming polysilicon and metal resistors. As such, the resistor is typically formed as a 2DEG resistor, which has a high temperature coefficient and subjects the output of the high-voltage level shifter to high variation. Additionally, while the n-type HEMT is in the ON state, there is static current from the power supply to the reference node, which lowers the power efficiency of the high-voltage level shifter. The resistance of the resistor may be increased to reduce the static current. However, increasing the resistance of the resistor increases the RC time constant at the output of the high-voltage level shifter and reduces switching speed at the output. This negates the benefits associated with the low parasitic capacitance of the n-type HEMT, compared to the n-type MOSFET, such that the high-voltage level shifter with the n-type HEMT may have switching speed comparable to that of the high-voltage level shifter with the n-type MOSFET.

Various embodiments of the present application are directed towards a level shifter with temperature compensation. In some embodiments, the level shifter comprises a transistor, a first resistor, and a second resistor. The first resistor is electrically coupled from a first source/drain of the transistor to a supply node, and the second resistor is electrically coupled from a second source/drain of the transistor to a reference node. Further, the first and second resistors have substantially the same temperature coefficients and comprise group III-V semiconductor material, the latter of which may lead to high temperature coefficients.

By having both the first and second resistors, the output of the level shifter is defined by the resistance ratio of the resistors. Further, since the first and second resistors have substantially the same temperature coefficients, resistances of the first and second resistors change by about the same percentage with changes in temperature. As a result, temperature induced changes in resistance are largely cancelled out in the ratio and the output of the level shifter is less susceptible to temperature induced change than the first and second resistors individually. Also, by having both the first and second resistors, static current may be reduced without materially impacting switching speed at the output of the level shifter. The second resistor may have a large resistance to reduce static current. The first resistor may have a small resistance so the RC time constant at output of the level shifter is small. The small RC time constant, in turn, allows fast switching speed.

With reference to FIG. 1, a circuit diagram 100 of some embodiments of a level shifter 102 with temperature compensation is provided. The level shifter 102 is configured to translate an input signal 104 at a first voltage domain to an output signal 106 at a second voltage domain that is high compared to the first voltage domain. For example, the first voltage domain may be about 6 volts or less, whereas the second voltage domain may be 100s of volts or more. Other voltages are, however, amenable for the first and second voltage domains. The level shifter 102 comprises a pull-up resistor 108, a transistor 110, and a pull-down resistor 112.

The pull-up resistor 108 electrically couples a first source/drain of the transistor 110 to a supply terminal 114, and the pull-down resistor 112 electrically couples a second source/drain of the transistor 110 to a return terminal 116. The first source/drain and the second source/drain may, for example, respectively be a drain and a source or vice versa. A power supply (not shown) of the second voltage domain is electrically coupled from the supply terminal 114 to the return terminal 116. The return terminal 116 serves as a reference for the level shifter 102 and, in some embodiments, is electrically coupled to ground. A gate of the transistor 110 is electrically coupled to an input terminal 118, and a body of the transistor 110 is electrically coupled to the return terminal 116. Further, an output terminal 120 is electrically coupled between the transistor 110 and the pull-up resistor 108.

During use of the level shifter, the input signal 104 switches between a high state and a low state. The high state may, for example, correspond to a power supply voltage of the first voltage domain, whereas the low state may, for example, correspond to zero volts. The switching of the input signal 104 switches the transistor 110 between an ON state and an OFF state. For example, the transistor 110 may be in an ON state and an OFF state respectively when the input signal 104 is in the high state and the low state or vice versa.

When the transistor 110 is in the OFF state, the voltage at the output terminal 120 is pulled up towards the voltage at the supply terminal 114 via the pull-up resistor 108. Assuming the output terminal 120 is electrically coupled to a high impedance input, the voltage at the output terminal 120 is equal to or about equal to the voltage at the supply terminal 114 and static current is negligible if not nonexistent. Note that it is assumed the output terminal 120 is electrically coupled to a high impedance input since the assumption simplifies the discussion and since the assumption will often, but not always, hold true.

When the transistor 110 is in the ON state, the voltage at the output terminal 120 is pulled down towards the voltage at the return terminal 116 via the pull-down resistor 112. Assuming the output terminal 120 is electrically coupled to a high impedance input, the level shifter 102 may be modeled as a voltage divider. The assumption simplifies the discussion and will often, but not always, hold true. When modeling the level shifter 102 as a voltage divider, the voltage at the output terminal 120 may be equal to or about equal to $$\frac{R_{pd} + R_{on}}{R_{pd} + R_{on} + R_{pu}} V_{ps},$$

where $R_{pd}$ is the resistance of the pull-down resistor 112, $R_{on}$ is the ON resistance of the transistor 110, $R_{pu}$ is the resistance of the pull-up resistor 108, and $V_{ps}$ is the voltage at the supply terminal 114. By adjusting the ratio between the resistances of the pull-up and pull-down resistors 108, 112, the voltage at the output terminal 120 may be controlled. Further, static current flowing along a conductive path 122, from the supply terminal 114 to the return terminal 116, may be reduced without materially reducing the switching speed at the output terminal 120.

Static current along the conductive path 122, from the supply terminal 114 to the return terminal 116, may be reduced by increasing the resistance from of the supply terminal 114 to the return terminal 116. Previous level shifters did not have the pull-down resistor 112 and hence achieved this by increasing the resistance of the pull-up resistor 108. However, increasing the resistance of the pull-up resistor 108 leads to a large RC time constant at the output terminal 120. The resistance of the RC time constant includes the resistance of the pull-up resistor 108, and the capacitance of the RC time constant includes parasitic capacitance of the transistor 110 and other parasitic capacitance at the output terminal 120. The large RC time constant, in turn, leads to poor switching speed at the output terminal 120, which is exacerbated by large voltage swings at the output terminal 120 when the transistor 110 switches between ON and OFF states. By including the pull-down resistor 112, the resistance from the supply terminal 114 to the return terminal 116 can be increased by way of the pull-down resistor 112 without materially increasing the RC time constant at the output terminal 120. This, in turn, allows static current to be reduced while keeping switching speed high.

In some embodiments, the pull-up and pull-down resistors 108, 112 have high temperature coefficients. A resistor with a high temperature coefficient may, for example, be a resistor that changes in resistance by more than 1%, 2%, 5%, or some other suitable percent per degree Celsius change in temperature. In some embodiment, the pull-up and pull-down resistors 108, 112 have the same or substantially the same temperature coefficients. The temperature coefficients may, for example, be "substantially" the same if each temperature coefficient is within 1%, 2%, 5%, or some other suitable percent of the other temperature coefficient. In some embodiments, the pull-up and pull-down resistors 108, 112 are formed simultaneously by the same process so as to have the same or substantially the same temperature coefficients.

Where the pull-up and pull-down resistors 108, 112 have high temperature coefficients that are the same or substantially the same, the combination of the pull-up and pull-down resistors 108, 112 provides temperature compensation. Previous level shifters did not have the pull-down resistor 112, whereby the voltage at the output terminal 120 was dominated by the resistance of the pull-up resistor 112 while the transistor 110 was in the ON state. Hence, the voltage at the output terminal 120 was subject to large variation as the resistance of the pull-up resistor 108 changed with temperature. By including the pull-down resistor 112, the voltage at the output terminal 120 is dominated by the ratio of the pull-up resistor 108 to the pull-down resistor 112. See the above discussion on modeling the level shifter 102 as a voltage divider. Since resistances of the pull-up and pull-down resistors 108, 112 change by the same or substantially the same percentage with temperature, the ratio between the resistances of the pull-up and pull-down resistors 108, 112 is less susceptible to change in temperature. As a result, the voltage at the output terminal 120 is less susceptible to changes in temperature.

In some embodiments, the pull-up and pull-down resistors 108, 112 have the same structure, albeit with difference dimensions. In other embodiments, the pull-up and pull-down resistors 108, 112 have different structures. In some embodiments, the pull-up and pull-down resistors 108, 112 have the structure of a depletion-mode HEMT without a gate and/or the structure of a depletion-mode metal-insulation-semiconductor field-effect transistor (MISFET) without a gate. In some embodiments, the pull-up and pull-down resistors 108, 112 comprise individual 2DEGs (not shown) or individual 2DHGs (not shown). In embodiments in which the pull-up and pull-down resistors 108, 112 comprise individual two-dimensional carrier gases (i.e., 2DEGs or 2DHGs), the pull-up and pull-down resistors 108, 112 comprise individual heterojunctions along which the two-dimensional carrier gases form. The heterojunctions may, for example, be or comprise gallium nitride (GaN), gallium arsenide, some other suitable group III-V material, or any combination of the foregoing.

In some embodiments, the transistor 110 is a HEMT, a MISFET, or some other suitable transistor. In some embodiments, the transistor 110 operates in enhancement mode. In other embodiments, the transistor 110 operates in depletion mode. In some embodiments, the transistor 110 has the same structure as the pull-up and/or pull-down resistor(s) 108, 112 with the addition of a gate structure. In some embodiments, the transistor 110 comprises and selectively conducts along a 2DEG (not shown), whereby the transistor 110 is n-type. In other embodiments, the transistor 110 comprises and selectively conducts along a 2DHG (not shown), whereby the transistor 110 is p-type. In embodiments in which the transistor 110 comprises a two-dimensional carrier gas (i.e., a 2DEG or a 2DHG), the transistor 110 comprises a heterojunction along which the two-dimensional carrier gas forms. The heterojunction may, for example, be or comprise gallium nitride, aluminum gallium nitride, gallium arsenide, some other suitable group III-V material, or any combination of the foregoing.

In some embodiments, the pull-up and pull-down resistors 108, 112 are 2DEG resistors and the transistor 110 is an n-type HEMT. Further, in some of such embodiments, 2DEGs of the pull-up and pull-down resistors 108, 112 and a 2DEG of the n-type HEMT are formed by heterostructures comprising group III-V materials, such as, for example, GaN or some other suitable material(s). By using group III-V materials for the pull-up and pull-down resistors 108, 112 and the transistor 110, the pull-up and pull-down resistors 108, 112 and the transistor 110 may operate at high voltages with small footprints compared to their silicon-based counterparts. Further, parasitic capacitance of the transistor 110 may be lower compared to its silicon-based counterpart, thereby allowing fast switching.

Figure 2:
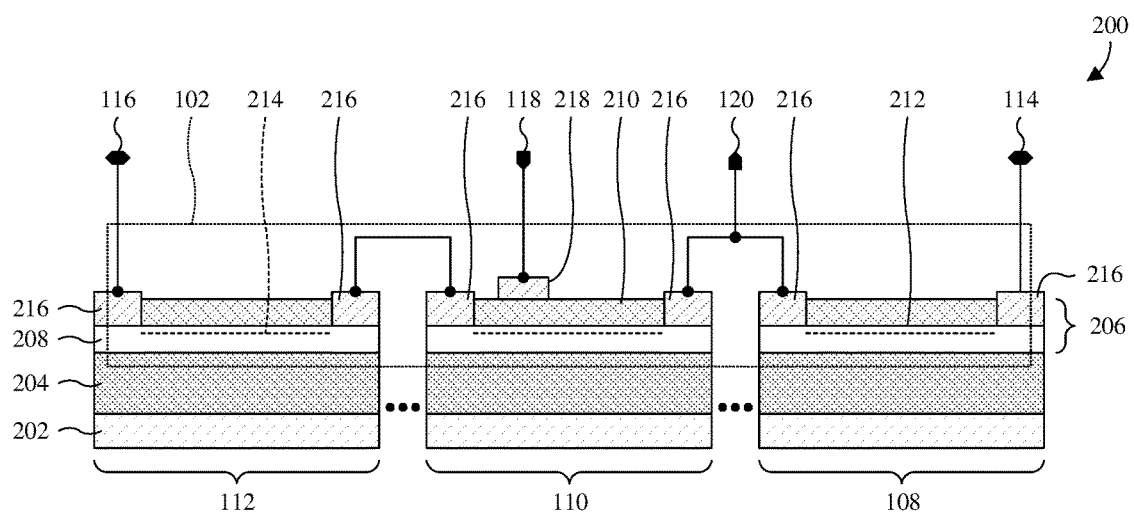
FIG. 2 illustrates a cross-sectional view of some embodiments of the level shifter of FIG. 1.

With reference to FIG. 2, a cross-sectional view 200 of some embodiments of the level shifter circuit 102 of FIG. 1 is provided. The level shifter circuit 102 is formed on a substrate 202. The substrate 202 may, for example, be or comprise monocrystalline silicon, silicon carbide, or some other semiconductor material, and/or may, for example, have a crystalline orientation of (111) or some other crystalline orientation. Further, the substrate 202 may, for example, be a bulk semiconductor substrate and/or may, for example, be a semiconductor wafer (e.g., a 300 or 450 millimeter semiconductor wafer).

A buffer structure 204 overlies the substrate 202, and a heterojunction structure 206 overlies the buffer structure 204. The buffer structure 204 may, for example, serve to compensate for differences in lattice constants, crystalline structures, thermal expansion coefficients, or any combination of the foregoing between the substrate 202 and the heterojunction structure 206. The buffer structure 204 may, for example, be or comprise aluminum nitride (AlN), GaN, some other suitable group III-V material(s), or any combination of the foregoing. The heterojunction structure 206 comprises a channel layer 208, and further comprises a barrier layer 210 overlying the channel layer 208.

The barrier layer 210 is polarized such that positive charge is shifted towards a lower or bottom surface of the barrier layer 210, and negative charge is shifted towards an upper or top surface of the barrier layer 210. The polarization may, for example, result from spontaneous polarization effects and/or piezoelectric polarization effects. The barrier layer 210 may be or comprise, for example, AlN, aluminum gallium nitride (AlGaN), some other group III nitride, some other group III-V material, or any combination of the foregoing. The channel layer 208 directly contacts the barrier layer 210 and is a semiconductor material with a band gap unequal to that of the barrier layer 210. Because of the unequal band gaps, the channel layer 208 and the barrier layer 210 define a heterojunction 212 at an interface at which the channel layer 208 and the barrier layer 210 directly contact. Further, because the barrier layer 210 is polarized, a 2DEG 214 forms in the channel layer 208. The 2DEG 214 extends along the heterojunction 212 and has a high concentration of mobile electrons, such that the 2DEG 214 is conductive. The channel layer 208 may, for example, be or comprises undoped GaN, some other group III nitride, or some other group III-V material. In some embodiments, the channel layer 208 is undoped GaN, whereas the barrier layer 210 is or comprises undoped AlGaN.

The pull-up resistor 108, the transistor 110, and the pull-down resistor 112 are on respective portions of the heterojunction structure 206. Electrical isolation between the portions of the heterojunction structure 206 may, for example, be achieved by mesa isolation, trench isolation, or some other suitable isolation. The pull-up resistor 108, the transistor 110, and the pull-down resistor 112 each comprise a pair of electrode 216, and the transistor 110 further comprises a gate structure 218. In some embodiments, the electrodes 216 extend through the barrier layer 210 to the channel layer 208. In other embodiments, the electrodes 216 overlie the barrier layer 210. The gate structure 218 overlies the heterojunction structure 206, laterally spaced from and laterally between correspond electrodes 216 of the transistor 110. In some embodiments, the gate structure 218 directly contacts the heterojunction structure 206. In other embodiments, the gate structure 218 is separated from the heterojunction structure 206 by a gate dielectric layer (not shown). The electrodes 216 and the gate structure 218 are conductive and may be or comprise, for example, aluminum copper, tungsten, copper, some other metal, doped polysilicon, some other conductive material, or any combination of the foregoing.

While not shown, electrical coupling between the pull-up resistor 108, the transistor 110, and the pull-down resistor 112 may, for example, be achieved by a back-end-of-line (BEOL) interconnect structure overlying the electrodes 216 and the gate structure 218. The BEOL interconnect structure may, for example, comprise a plurality of wires and a plurality of vias alternatingly stacked to define conductive paths interconnecting the pull-up resistor 108, the transistor 110, and the pull-down resistor 112 as shown in FIG. 1.

Figure 3A:
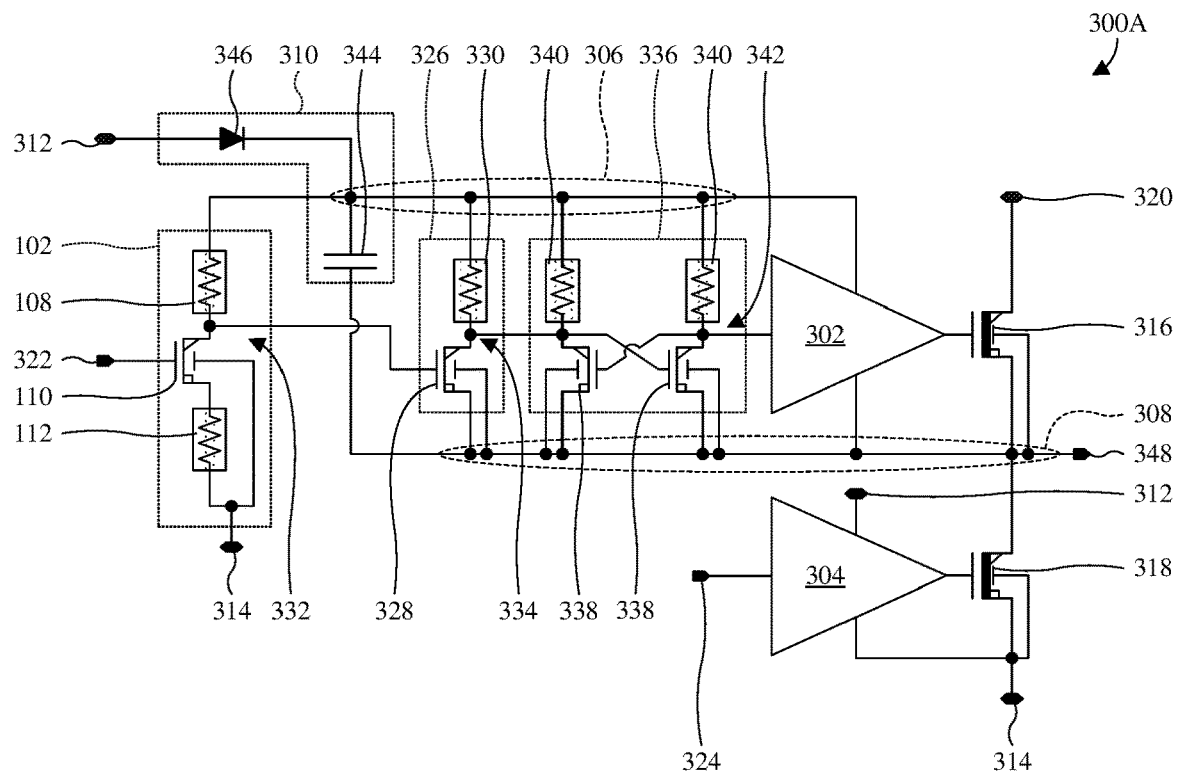
FIGS. 3A-3F illustrate circuit diagrams of various embodiments of a gate driver circuit in which the level shifter of FIG. 1 finds application.

With reference to FIG. 3A, a circuit diagram 300A of some embodiments of a gate driver circuit in which the level shifter 102 of FIG. 1 finds application is provided. The gate driver circuit comprises a high-side gate driver 302 and a low-side gate driver 304. The high-side gate driver 302 operates at a high-side voltage domain and is powered by a dynamic power supply via a high-side supply node 306 and a high-side return node 308. As discussed hereafter, the dynamic power supply is defined at least partially by a bootstrap circuit 310 and a high-voltage power supply (not shown). The low-side gate driver 304 operates at a low-side voltage domain and is powered by a low voltage power supply (not shown) via a low-side supply terminal 312 and a low-side return terminal 314. The low-side return terminal 314 serves as a reference for the gate driver circuit and may, for example, be grounded. For ease of illustration, the low-side supply terminal 312 and the low-side return terminal 314 each appear multiple times. However, the multiple instances of the low-side supply terminal 312 are the same terminal, and the multiple instances of the low-side return terminal 314 are the same terminal.

The high-voltage power supply supplies a high voltage relative to low voltage power supply. For example, the high-voltage power supply may supply 650 volts or more, whereas the low voltage power supply may supply 6 volts or less. Other voltages are, however, amenable. Further, the high-voltage power supply and the low voltage power supply may, for example, be DC power supplies or some other suitable power supplies.

The high-side gate driver 302 gates a high-side power transistor 316, and the low-side gate driver 304 gates a low-side power transistor 318. A first source/drain of the high-side power transistor 316 is electrically coupled to a high-voltage supply terminal 320, whereas a second source/drain of the high-side power transistor 316 is electrically coupled to the high-side return node 308. The high-voltage power supply is electrically coupled from the high-voltage supply terminal 320 to the low-side return terminal 314 to bias the high-voltage supply terminal 320 with a high voltage. A first source/drain of the low-side power transistor 318 is electrically coupled to the high-side return node 308, and a second terminal of the low-side power transistor 318 is electrically coupled to the low-side return terminal 314. The high-side and low-side power transistors 316, 318 may, for example, be power MOSFETs, insulated-gate bipolar transistors (IGBTs), or some other suitable power transistors capable of sustained operation at the high voltages of the high-voltage power supply.

Additionally, the high-side gate driver 302 is controlled by a high-side input signal at a high-side input terminal 322, and the low-side gate driver 304 is controlled by a low-side input signal at a low-side input terminal 324. The high-side and low-side input signals are both at the low-side voltage domain and switch between a low state and a high state. The low state may, for example, correspond to the voltage at the low-side return terminal 314, and the high state may, for example, correspond to the voltage at the low-side supply terminal 312. Depending upon whether the high-side input signal is in the high state or low state, the high-side gate driver 302 enables or disables the high-side power transistor 316. Similarly, depending upon whether the low-side input signal is in the high state or low state, the low-side gate driver 304 enables or disables the low-side power transistor 318. Further, the high-side and low-side input signals are generated so the high-side power transistor 316 is only in the ON state while the low-side power transistor 318 is in the OFF state and vice versa Since the high-side input signal is at the low-side voltage domain and the high-side gate driver 302 operates at the high-side voltage domain, the high-side input signal is incompatible with the high-side gate driver 302. Therefore, the level shifter 102 is used to translate the input signal from the low-side voltage domain to the high-side voltage domain. Operation of the level shifter 102 is as described in FIG. 1, but the high-side input terminal 322 corresponds to the input terminal 118 of FIG. 1, the low-side return terminal 314 corresponds to the return terminal 116 of FIG. 1, and the high-side supply node 306 corresponds to the supply terminal 114 of FIG. 1. Further, in some embodiments, a resistance ratio between the pull-up resistor 108 and the pull-down resistor 112 is selected so a voltage across the pull-up resistor 108 is about equal to the voltage at the low-side supply terminal 312 when the high-side is in the ON state.

A shaper 326 reshapes an output signal of the level shifter 102 to improve the slew rate of the output signal. By improving the slew rate, the shaper 326 allows faster switching of the high side between the ON state and the OFF state. The shaper 326 is powered by the dynamic power supply and comprises a shaper transistor 328 and a shaper resistor 330. A first source/drain of the shaper transistor 328 is electrically coupled to the high-side supply node 306 via the shaper resistor 330, and a second source/drain of the shaper transistor 328 is electrically coupled to the high-side return node 308. Further, a gate of the shaper 326 is electrically coupled to an output 332 of the level shifter 102, such that it should be appreciated that output 332 is electrically coupled to a high impedance input. The output 332 of the level shifter 102 may, for example, correspond to the output terminal 120 of FIG. 1. In some embodiments, the shaper resistor 330 is as the pull-up and pull-down resistors 108, 112 of the level shifter 102 are described with regard to FIG. 1 and/or is a group III-V 2DEG resistor. In some embodiments, the shaper transistor 328 is as the transistor 110 of the level shifter 102 is described with regard to FIG. 1 and/or is a group III-V 2DEG transistor.

The shaper 326 operates similar to the level shifter 102 in that it selectively pulls the voltage at a shaper output 334 up or down depending upon whether the shaper transistor 328 is in an ON state or an OFF state. For example, the voltage at the shaper output 334 is pulled up towards the voltage of the high-side supply node 306 when the shaper transistor 328 is in the OFF state, and the voltage at the shaper output 334 is pulled down towards the voltage at the high-side return node 308 when the shaper transistor 328 is in the ON state. Further, the shaper transistor 328 is in the ON state or the OFF state depending on whether the output 332 of the level shifter 102 is in the high state or the low state. Therefore, the shaper output 334 recreates the output 332 of the level shifter 102. In some embodiments, the shaper output 334 is inverted relative to the output 332 of the level shifter 102.

A latch 336 latches the shaper output 334 to filter noise at the shaper output 334. By filtering noise, the latch 336 allows faster switching of the high side between ON and OFF states. The latch 336 is powered by the dynamic power supply and comprises a pair of latch transistors 338 and a pair of latch resistors 340. Each of the latch transistors 338 has a first source/drain electrically coupled to the high-side supply node 306 by a respective one of the latch resistors 340, and further has a second source/drain electrically coupled to the high-side return node 308. Further, a gate of a first one of the latch transistors 338 is electrically coupled to the shaper output 334 and the first source/drain of a second one of the latch transistors 338, while a gate of the second one of the latch transistors 338 is electrically coupled to the first source/drain of the first one of the latch transistors 338 and a latch output 342. In some embodiments, the latch resistors 340 are as the pull-up and pull-down resistors 108, 112 of the level shifter 102 are described with regard to FIG. 1 and/or are group III-V 2DEG resistors. In some embodiments, the latch transistors 338 are as the transistor 110 of the level shifter 102 is described with regard to FIG. 1 and/or are group III-V 2DEG transistors.

The latch transistors 338 are connected so as to create a feedback loop. For example, an output of the first one of the latch transistors 338 feeds back to gate of the second one of the latch transistors 338 and vice versa. When the shaper output 334 is in a first state (e.g., a high state), the feedback loop moves the latch output 342 towards a first steady state. Similarly, when the shaper output 334 is in a second state, the feedback loop moves the latch output 342 towards a second steady state. Assuming the shaper output 334 persists in a state for a minimum amount of time, the feedback loop reaches the first or second steady state. At steady state, the latch 336 resists change and persists at steady state until the shaper output 334 changes for the minimum amount of time. The resistance to change allows the latch 336 to filter noise.

As noted above, the dynamic power supply powering the shaper 326, the latch 336, and the high-side gate driver 302 is partially defined by the bootstrap circuit 310 and the high-voltage power supply (not shown). The bootstrap circuit 310 comprises a bootstrap capacitor 344 and a bootstrap diode 346. A first terminal of the bootstrap capacitor 344 is electrically coupled to the high-side supply node 306, and a second terminal of the bootstrap capacitor 344 is electrically coupled to the high-side return node 308. An anode of the bootstrap diode 346 is electrically coupled to the low-side supply terminal 312, and a cathode of the bootstrap diode 346 is electrically coupled to the high-side supply node 306.

During use of the gate driver circuit, a load (not shown) is electrically coupled from the high-side return node 308, via a load terminal 348, to the low-side return terminal 314. In some, but not all, embodiments, the load is an inductive load and/or an electric motor. Further, the high-side input signal at the high-side input terminal 322 and the low-side input signal at the low-side input terminal 324 are generated so the high-side power transistor 316 is only in the ON state while the low-side power transistor 318 is in the OFF state and vice versa.

When the low-side power transistor 318 is in the ON state and the high-side power transistor 316 is in the OFF state, the high-side return node 308 is electrically coupled to the low-side return terminal 314 via the low-side power transistor 318. Therefore, the low-side return terminal 314 and the high-side return node 308 are at about the same voltage. Since the low-side return terminal 314 is the reference for the gate driver circuit, the low-side return terminal 314 and the high-side return node 308 are at about zero volts. Further, since the load (not shown) is electrically coupled from the high-side return node 308 to the low-side return terminal 314, the voltage across the load is about zero and the load is disabled.

Also, when the low-side power transistor 318 is in the ON state and the high-side power transistor 316 is in the OFF state, the bootstrap capacitor 344 is charged and the voltage at the low-side supply terminal 312 is higher than the voltage at the high-side supply node 306. As such, the bootstrap diode 346 is in a non-blocking state. Further, an electrical path extends from the low-side supply terminal 312, through the bootstrap capacitor 344, to the high-side return node 308 (or equivalent to the low-side return terminal 314 at the instant state), such that the bootstrap capacitor 344 is charged to about the voltage at the low-side supply terminal 312. For example, the bootstrap capacitor 344 may be charged to about 6 volts or some other suitable voltage. As the bootstrap capacitor 344 is charged, the voltage at the high-side supply node 306 increases to about the voltage at the low-side supply terminal 312.

When the low-side power transistor 318 is in the OFF state and the high-side power transistor 316 is in the ON state, the high-voltage supply terminal 320 is electrically coupled to the high-side return node 308 via the high-side power transistor 316. Therefore, the high-voltage supply terminal 320 and the high-side return node 308 are at about the same voltage. Further, the voltage at the high-side supply node 306 is equal to or about equal to the voltage at the high-side return node 308 plus the voltage across the bootstrap capacitor 344. For example, the voltage at the high-side return node 308 may, for example, be about 650 volts, and the voltage at the high-side supply node 306 may, for example, be about 656 volts. Other voltages are, however, amenable. Since the load (not shown) is electrically coupled from the high-side return node 308 to the low-side return terminal 314, the voltage across the load is about that of the high-voltage supply terminal 320 and the load is enabled.

Also, when the low-side power transistor 318 is in the OFF state and the high-side power transistor 316 is in the ON state, the voltage at the low-side supply terminal 312 is lower than that at the high-side supply node 306. As such, the bootstrap diode 346 is in a blocking state that electrically isolates the low-side supply terminal 312 and the high-voltage supply terminal 320. Absent this isolation, damage may occur to power supplies electrically coupled respectively to the low-side supply terminal 312 and the high-voltage supply terminal 320.

As seen above, the voltages at the high-side supply node 306 and the high-side return node 308 vary in accordance with a dynamic power supply. By using the dynamic power supply, and/or by adjusting the resistance ratio between the pull-up and pull-down resistors 108, 112, the voltage across the pull-up resistor 108 may be reduced. This may, for example, enhance switching speed at the output 332 of the level shifter 102. Further, by using the dynamic power supply, the voltage difference between the high-side supply node 306 and the high-side return node 308 is small even when the high-side supply node 306 and the high-side return node 308 are at high voltages. For example, the voltages at the high-side supply node 306 and the high-side return node 308 may respectively be about 656 volts and 650 volts, such that the voltage difference is about 6 volts. Other voltages are, however, amenable. Due to the small voltage difference, components at the high side may be designed for operation at low voltages. Such components include, for example, the shaper 326, the latch 336, and the high-side gate driver 302. Since the components at the high side may be designed for operation at low voltages, design constraints may be relaxed. Further, the size of the components may be reduced.

Figure 3B:
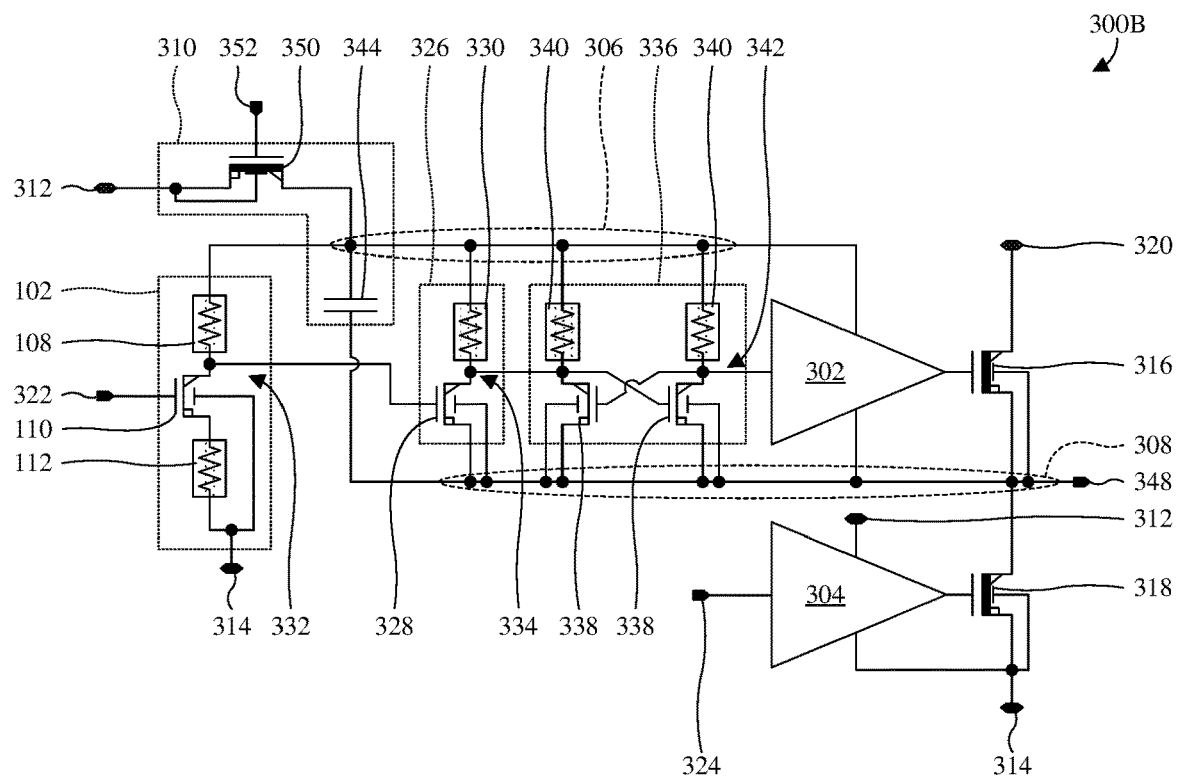

With reference to FIG. 3B, a cross-sectional view 300B of some alternative embodiments of the gate driver circuit of FIG. 3A is provided in which a bootstrap transistor 350 is used in place of the bootstrap diode 346 of FIG. 3A. In such embodiments, a controller (not shown) is electrically coupled to a gate of the bootstrap transistor 350 via a bootstrap terminal 352. The controller enables the bootstrap transistor 350 while the low-side power transistor 318 is in the ON state and the high-side power transistor 316 is in the OFF state to charge the bootstrap capacitor 344. Further, the controller disables the bootstrap transistor 350 while the low-side power transistor 318 is in the OFF state and the high-side power transistor 316 is in the ON state to electrically separate the low-side supply terminal 312 from the high-side supply node 306. Using the controller and the bootstrap transistor 350 in place of the bootstrap diode 346 allows the low-side supply terminal 312 to be electrically coupled to and electrically separated from the high-side supply node 306 faster than would be possible with the bootstrap diode 346. This, in turn, allows faster switching of the high-side and low-side power transistors 316, 318 between high and low states. In some embodiments, the bootstrap transistor 350 is as the transistor 110 is described with regard to FIG. 1. Further, in some embodiments, the bootstrap transistor 350 is a group III-V 2DEG transistor.

Figure 3C:
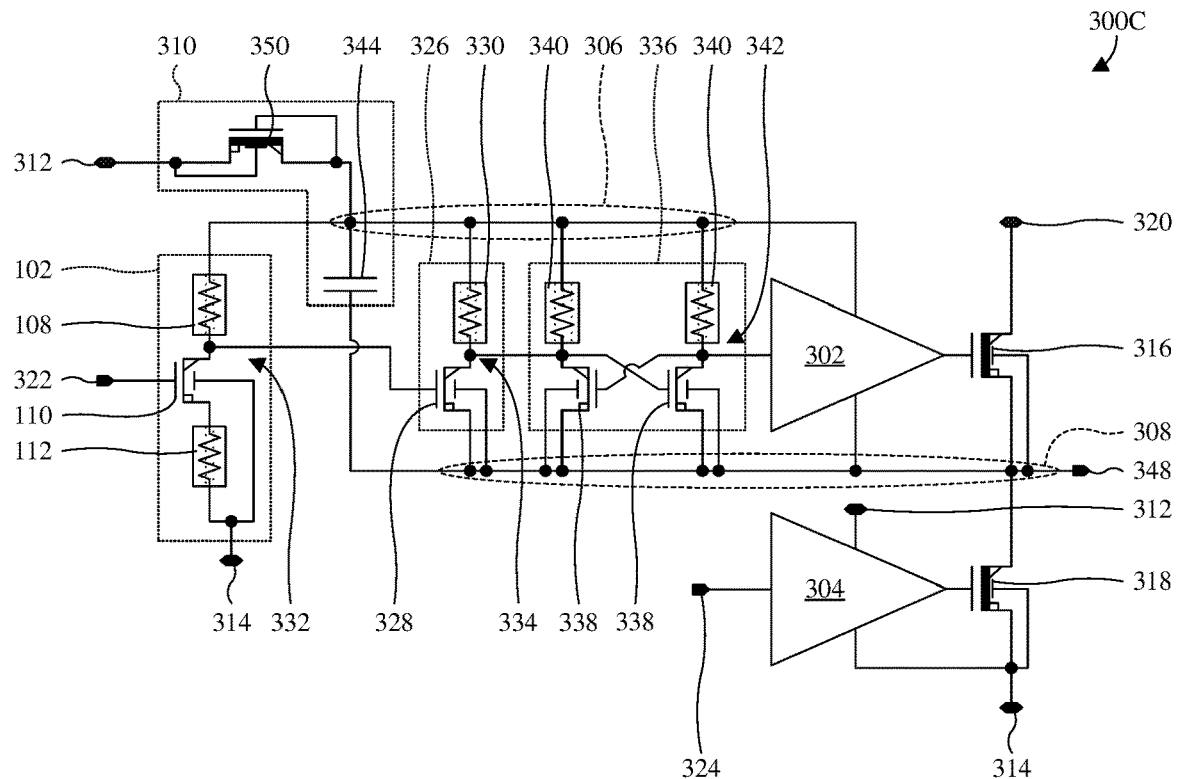

With reference to FIG. 3C, a cross-sectional view 300C of some alternative embodiments of the gate driver circuit of FIG. 3B is provided in which the bootstrap transistor 350 is diode connected. In the diode connected configuration, a gate of the bootstrap transistor 350 is electrically coupled to a drain of the bootstrap transistor 350, which is electrically coupled to the low-side supply terminal 312. Further, in the diode connected configuration, the bootstrap transistor 350 acts as the bootstrap diode 346 is described with regard to FIG. 3A.

Figure 3D:
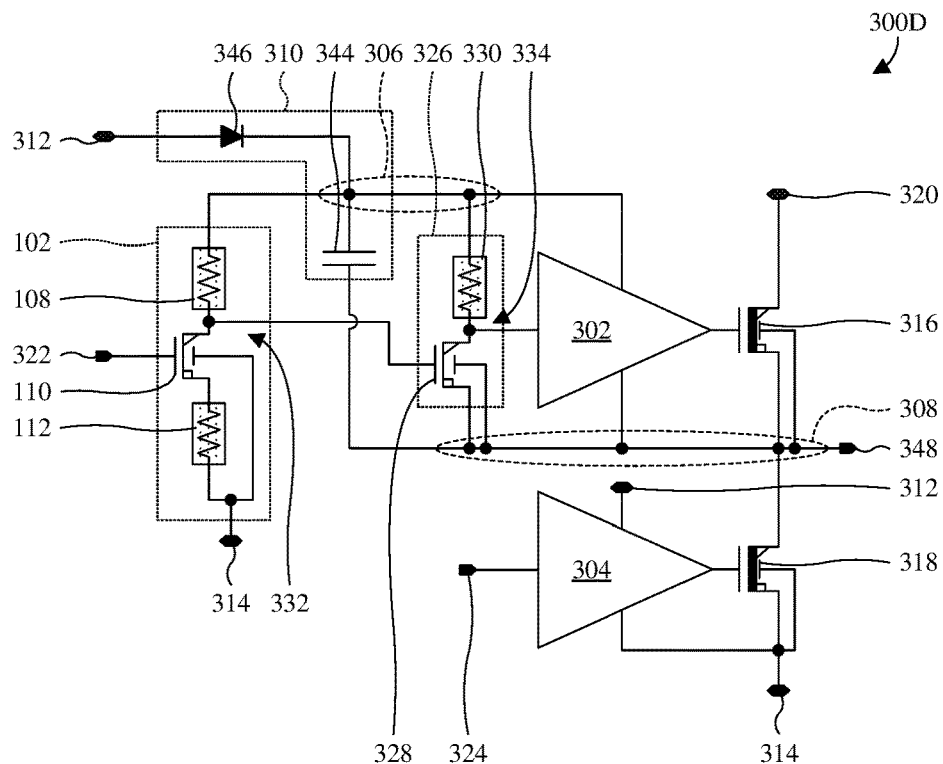

With reference to FIG. 3D, a cross-sectional view 300D of some alternative embodiments of the gate driver circuit of FIG. 3A is provided in which the latch 336 of FIG. 3A is omitted. As such, the shaper output 334 of the shaper 326 feeds into the high-side gate driver 302 to control the high-side gate driver 302.

Figure 3E:
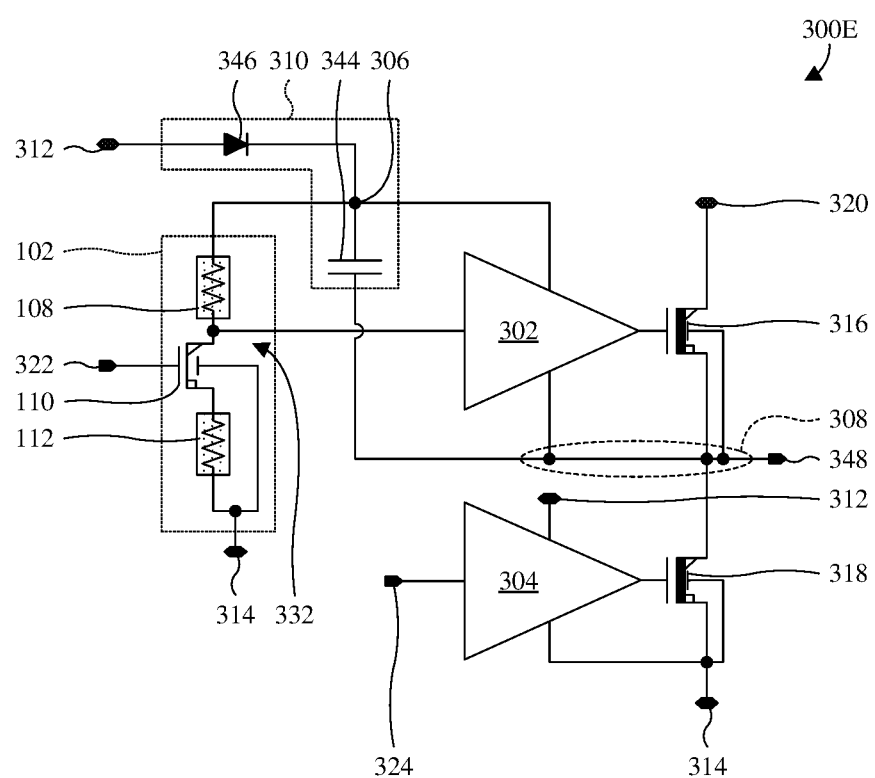

With reference to FIG. 3E, a cross-sectional view 300E of some alternative embodiments of the gate driver circuit of FIG. 3A is provided in which the shaper 326 of FIG. 3A and the latch 336 of FIG. 3A are omitted. As such, the output 332 of the level shifter 102 feeds into the high-side gate driver 302 to control the high-side gate driver 302.

Figure 3F:
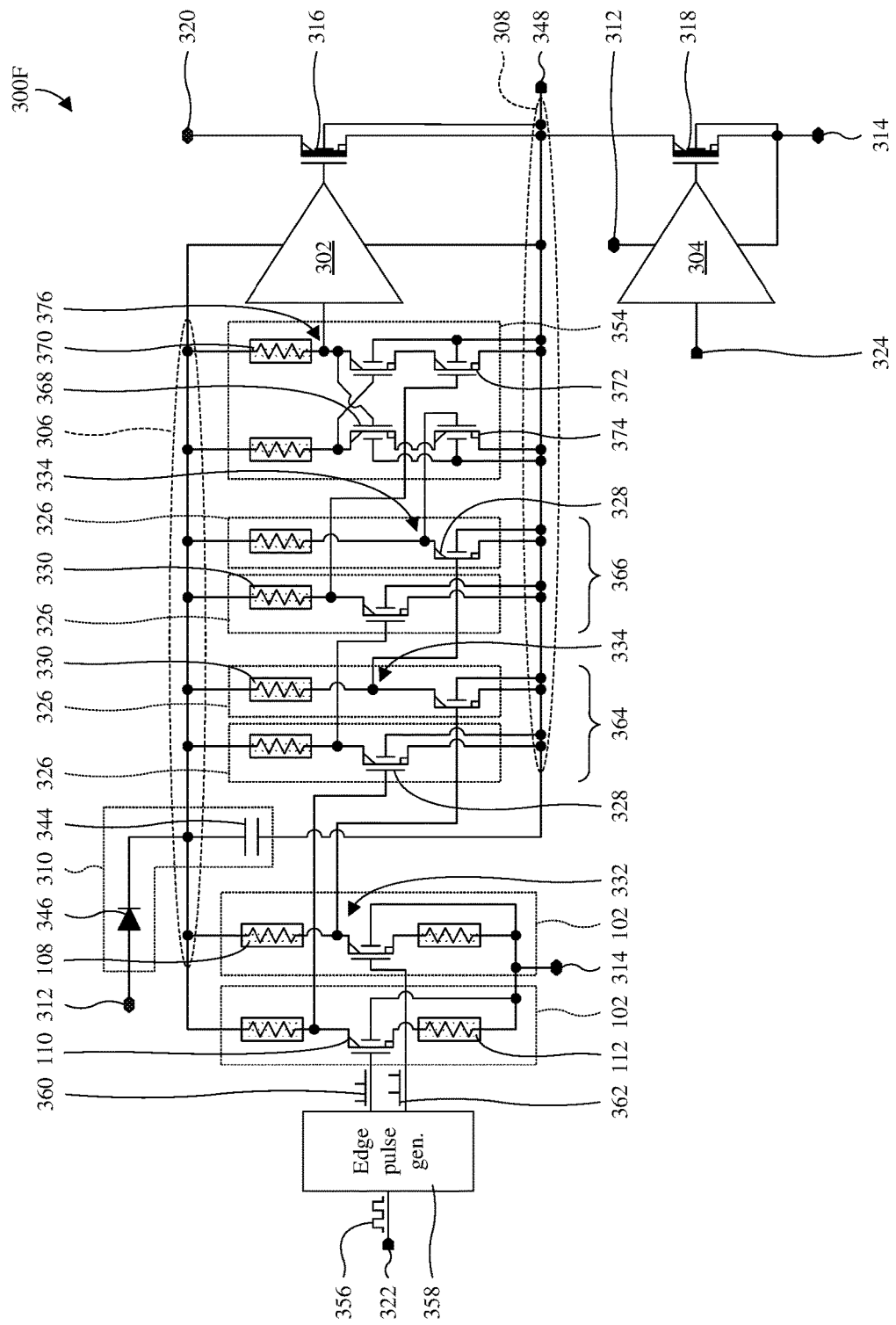

With reference to FIG. 3F, a cross-sectional view 300F of some alternative embodiments of the gate driver circuit of FIG. 3A is provided in which a flip flop 354 is used in place of the latch 336 of FIG. 3A. The flip flop 354 allows a high-side input signal 356 at the high-side input terminal 322 to be pulsed or alternating coupled (AC) coupled, which aids in eliminating static current at level shifters 102 of the gate driver circuit. To accommodate the flip flop 354, the high-side input terminal 322 is electrically coupled to an edge pulse generator 358. The edge pulse generator 358 generates a rising-edge signal 360 and a falling-edge signal 362 from the high-side input signal 356. The rising-edge signal 360 comprises a pulse at each rising edge of the high-side input signal 356, and the falling-edge signal 362 comprises a pulse at each falling edge of the high-side input signal 356.

Two level shifters 102 respectively receive the rising-edge signal 360 and the falling-edge signal 362 as inputs. The level shifters 102 are each as described with regard to FIG. 1, such that each of the level shifters 102 comprises a pull-up resistor 108, a transistor 110, and a pull-down resistor 112. For ease of illustration, the pull-up resistor 108 is only labeled for one of the level shifters 102, the transistor 110 is only labeled for one of the level shifters 102, and the pull-down resistor 112 is only labeled for one of the level shifters 102. The outputs 332 of the level shifters 102 respectively control shapers 326. For ease of illustration, only one of the outputs 332 of the level shifters 102 is labeled 332.

The shapers 326 are grouped into a first shaper stage 364 and a second shaper stage 366, each comprising two of the shapers 326. The shapers 326 are each as described with regard to FIG. 3A, such that each of the shapers 326 comprises a shaper resistor 330 and a shaper transistor 328. For ease of illustration, the shaper resistor 330 is only labeled for some of the shapers 326 and the shaper transistor 328 is only labeled for some of the shapers 326. The two shapers 326 of the first shaper stage 364 respectively receive the outputs 332 of the level shifters 102, and the shapers 326 of the second shaper stage 366 respectively receive the shaper outputs 334 of the first shaper stage 364. The shaper outputs 334 of the second shaper stage 366 control the flip flop 354. For ease of illustration, only some of the shaper outputs 334 are labeled 334.

The flip flop 354 is powered by the dynamic power supply and comprises a pair of storage transistors 368, a pair of flip flop resistors 370, a set transistor 372, and a reset transistor 374. For ease of illustration, only one of the storage transistors 368 is labeled 368 and only one of the flip flop resistors 370 is labeled 370. Each of the storage transistors 368 has a first source/drain electrically coupled to the high-side supply node 306 by a respective one of the flip flop resistors 370, and further has a second source/drain electrically coupled selectively to the high-side return node 308 by a respective one of the set and reset transistors 372, 374. A gate of a first one of the storage transistors 368 is electrically coupled to the first source/drain of a second one of the storage transistors 368, while a gate of the second one of the storage transistors 368 is electrically coupled to the first source/drain of the first one of the storage transistors 368 and a flip flop output 376. The gates of the set and reset transistors 372, 374 are electrically coupled respectively to the shaper outputs 334 of the second shaper stage 366. In some embodiments, the flip flop resistors 370 are as the pull-up and pull-down resistors 108, 112 of the level shifter 102 are described with regard to FIG. 1 and/or are group III-V 2DEG resistors. In some embodiments, the storage transistors 368, the set transistor 372, the reset transistor 374, or any combination of the foregoing is/are as the transistor 110 of the level shifter 102 is described with regard to FIG. 1 and/or is/are group III-V 2DEG transistors.

The storage transistors 368 are connected so as to create a feedback loop. For example, an output of the first one of the storage transistors 368 feeds back to gate of the second one of the storage transistors 368 and vice versa. Based on stimuli from the set and reset transistors 372, 374, the feedback loop switches between steady states at the flip flop output 376. When the set transistor 372 is activated, the feedback loop moves the flip flop output 376 to a first steady state. When the reset transistor 374 is activated, the feedback loop moves the flip flop output 376 towards a second steady state.

While FIGS. 3D-3F are illustrated using the bootstrap diode 346, the bootstrap diode 346 in any one of FIGS. 3D-3F may be replaced by the bootstrap transistor 350 in FIG. 3B. while FIGS. 3D-3F are illustrated using the bootstrap diode 346, the bootstrap diode 346 in any one of FIGS. 3D-3F may be replaced by the bootstrap transistor 350 in FIG. 3C. While FIG. 3F is illustrated with two shaper stages 364, 366, more or less shaper stages are amenable. While FIGS. 3A-3D are illustrated with one shaper stage, more shaper stages are amenable.

Figure 4:
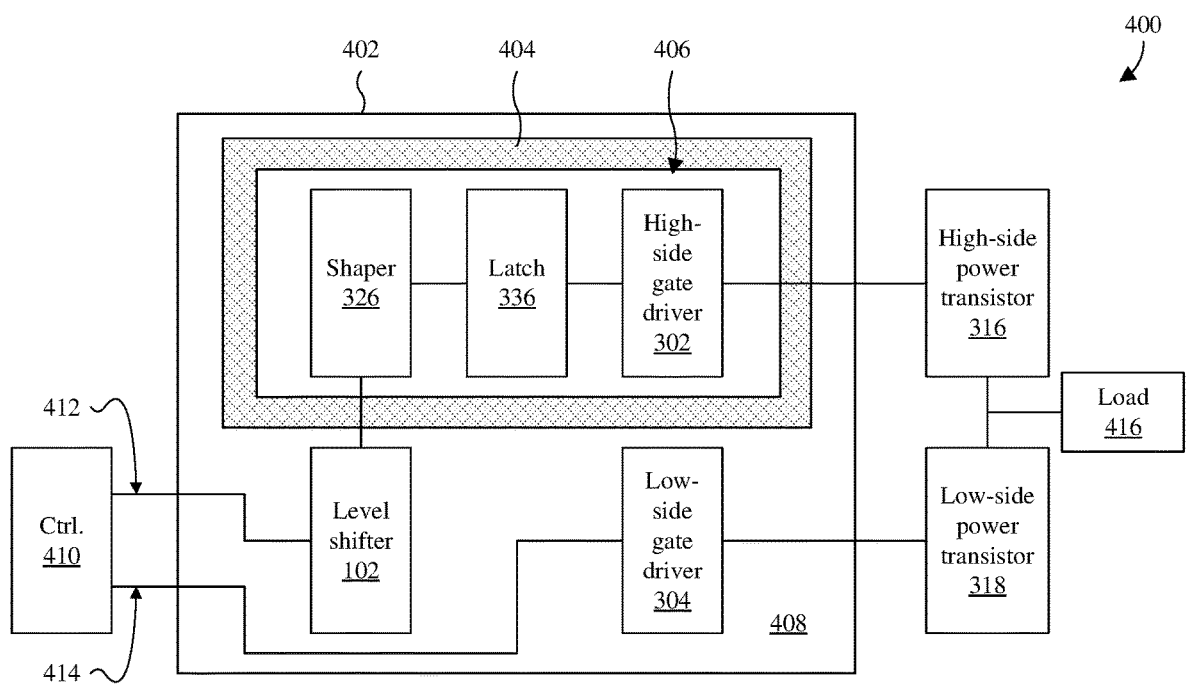
FIG. 4 illustrates a layout of some embodiments of the gate driver circuit of FIG. 3A.

With reference to FIG. 4, a layout 400 of some embodiments of the gate driver circuit of FIG. 3A is provided. The level shifter 102, the low-side gate driver 304, the shaper 326, the latch 336, and the high-side gate driver 302 are integrated together into a common integrated circuit (IC) chip 402. Because the shaper 326, the latch 336, and the high-side gate driver 302 are powered by a dynamic power supply operating at a different voltage domain than the level shifter 102 and the low-side gate driver 304, an isolation region 404 may, for example, be employed. The isolation region 404 demarcates a high-side area 406 of the IC chip 402 within which the shaper 326, the latch 336, and the high-side gate driver 302 are located, and further demarcates a low-side area 408 of the IC chip 402 within which the level shifter 102 and the low-side gate driver 304 are located. The isolation region 404 may, for example, be or comprise a trench isolation region, a mesa isolation region, or some other suitable isolation region.

A controller 410 is external to the IC chip 402 and generates a high-side input signal 412 and a low-side input signal 414. The high-side input signal 412 indirectly controls the high-side power transistor 316 through the level shifter 102, the shaper 326, the latch 336, and the high-side gate driver 302, whereas the low-side input signal 414 indirectly controls the low-side power transistor 318 through the low-side gate driver 304. Similar to the controller 410, the high-side and low-side power transistors 316, 318 may, for example, be external to the IC chip 402. The high-side and low-side power transistors 316, 318 are employed to selectively enable a load 416.

While FIG. 4 is illustrated using embodiments of the gate driver circuit in FIG. 3A, it is to be understood that embodiments of the gate driver circuit in any one of FIGS. 3B-3F may also be used. For example, where embodiments of the gate driver circuit in FIG. 3D are used, the latch 336 is omitted from the high-side area 406. As another example, where embodiments of the gate driver circuit in FIG. 3F are used, the latch 336 is replaced with a flip flop and additional shapers. As yet another example, where embodiments of the gate driver circuit in FIG. 3E are used, the latch 336 and the shaper 326 are omitted from the high-side area 406.

Figure 5A:
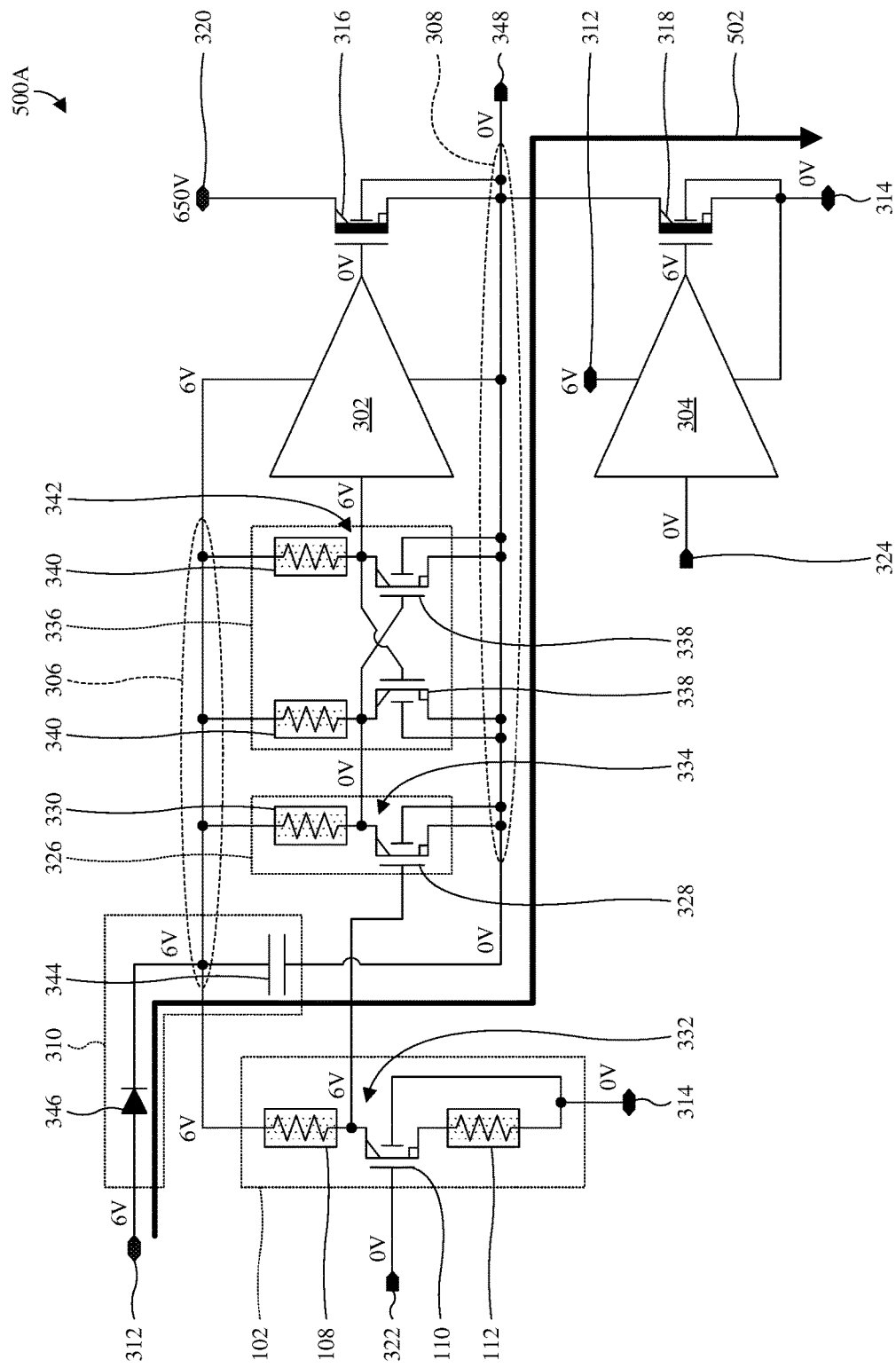
FIGS. 5A and 5B illustrate circuit diagrams of the gate driver circuit of FIG. 3A at various states using non-limiting example voltages.
Figure 5B:
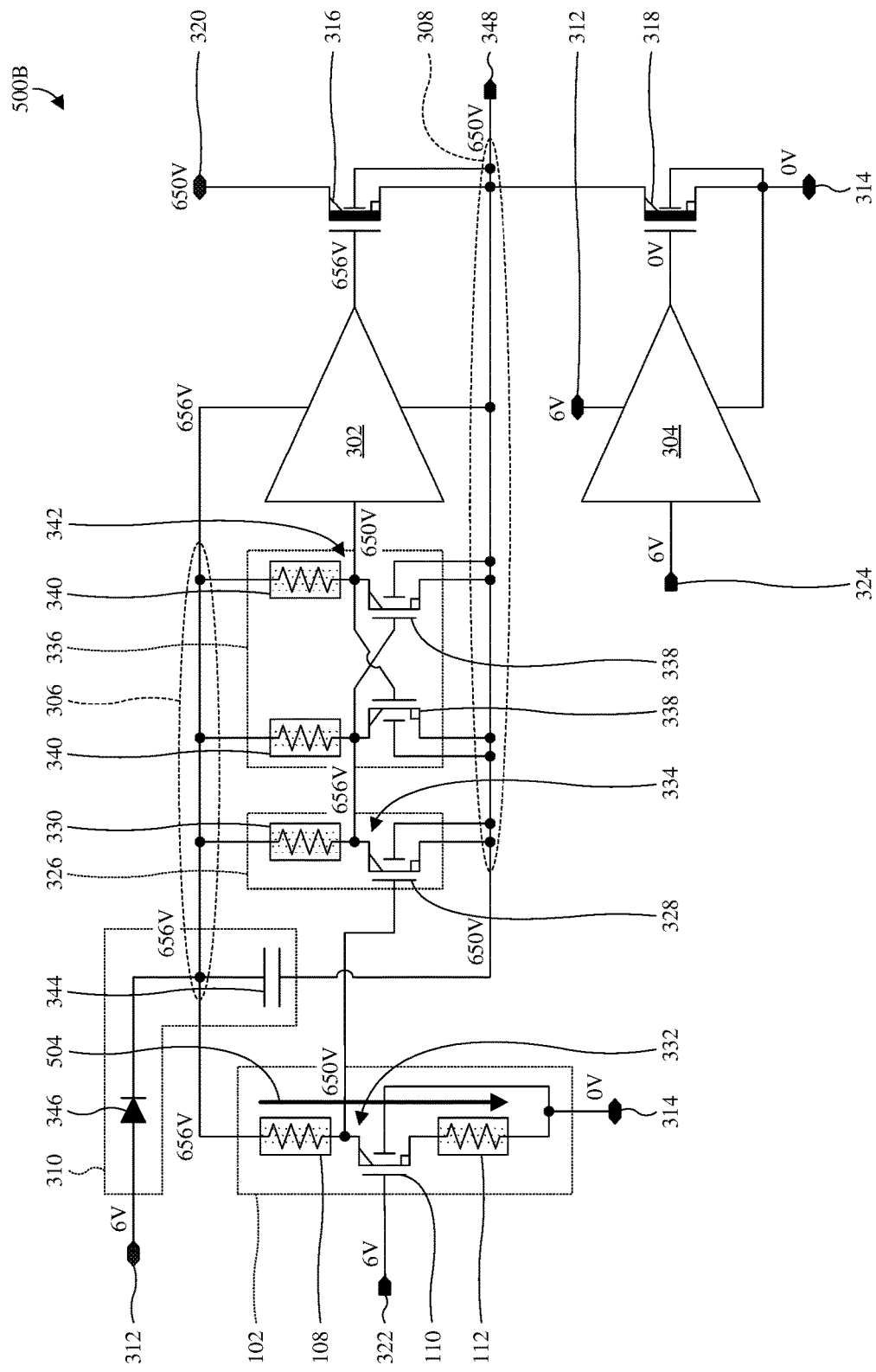

With reference to FIGS. 5A and 5B, circuit diagrams 500A, 500B of some embodiments of the gate driver circuit of FIG. 3A at various states are provided using non-limiting example voltages. FIG. 5A illustrate the gate driver circuit in an OFF state, whereas FIG. 5B illustrates the gate driver circuit in an ON state. By the OFF state of the gate driver circuit, it is meant that the load (not shown) driven by the gate driver circuit is in the OFF state. Similarly, by the ON state of the gate driver circuit, it is meant that the load driven by the gate driver circuit is in the ON state. As discussed above, the load is electrically coupled from the load terminal 348 to the low-side return terminal 314.

With specific reference to the circuit diagram 500A of FIG. 5A, the high-voltage supply terminal 320 is biased at about 650 volts by a high-voltage power supply (not shown), and the low-side supply terminal 312 is biased at about 6 volts by a low voltage power supply (not shown). Further, a high-side input signal at the high-side input terminal 322 and a low-side input signal at the low-side input terminal 324 are at about 0 volts.

The high-side and low-side input signals respectively control the high-side power transistor 316 and the low-side power transistor 318 to enable or disable the load (not shown). The high-side and low-side input signals are generated at a low-side voltage domain defined by the low voltage power supply (not shown), such that the high-side and low-side input signals vary between about 0 volts and about 6 volts depending upon a state of the gate driver circuit. Further, the high-side and low-side input signals are generated so the high-side power transistor 316 is in the OFF state, while the low-side power transistor 318 is in the ON state, and vice versa. To have the high-side and low-side power transistors 316, 318 simultaneously in the ON states leads to a low impedance path from the high-voltage supply terminal 320 to the low-side return terminal 314 that may damage the high-voltage power supply (not shown).

The about 0 volts at the low-side input terminal 324 triggers the low-side gate driver 304 to output about 6 volts to a gate of the low-side power transistor, assuming the low-side gate driver 304 is inverting. In other embodiments, the low-side gate driver 304 is non-inverting. The about 6 volts at the output of the low-side gate driver 304, in turn, enables the low-side power transistor 318. As a result, the voltages respectively at the high-side return node 308 and the low-side return terminal 314 are about the same. This, in turn, disables the load (not shown) since the voltage across the load is about 0 volts. Further, since the low-side return terminal 314 is the reference for the gate driver circuit, the voltages respectively at the high-side return node 308 and the low-side return terminal 314 are about 0 volts.

The about 0 volts at the high-side input terminal 322 disables the transistor 110 of the level shifter 102. As a result, the pull-down resistor 112 is electrically isolated from the output 332 of the level shifter 102 by the transistor 110 of the level shifter 102. Further, the voltage at the output 332 of the level shifter 102 is pulled up by the pull-up resistor 108 towards the voltage at the high-side supply node 306. Since the output 332 of the level shifter 102 is electrically coupled to a gate of the shaper 326, which is a high impedance input, the voltage at the output 332 of the level shifter 102 is about the same as the voltage at the high-side supply node 306. As illustrated, the voltages respectively at the high-side supply node 306 and the output 332 of the level shifter 102 are about 6 volts. However, when first transitioning to about 0 volts at high-side input terminal 322, the voltages respectively at the high-side supply node 306 and the output 332 of the level shifter 102 are less than about 6 volts.

The voltages respectively at the high-side supply node 306 and the output 332 of the level shifter 102 are defined by the voltage across the bootstrap capacitor 344 since the high-side return node 308 is at about 0 volts. Further, the bootstrap capacitor 344 is previously discharged when first transitioning to about 0 volts at high-side input terminal 322. Therefore, voltage at the high-side supply node 306 is less than about 6 volts when first transitioning to 0 volts at high-side input terminal 322. The voltages respectively at the high-side supply node 306 and the output 332 of the level shifter 102 reach about 6 volts after the bootstrap capacitor 344 is completely charged. The bootstrap capacitor 344 is charged along a conductive path 502 that extends from the low-side supply terminal 312, through the bootstrap diode 346, the bootstrap capacitor 344, and the low-side power transistor 318, to the low-side return terminal 314. Because the voltage at the high-side supply node 306 is less than the voltage at the low-side supply terminal 312 (e.g., 3 volts vs. 6 volts) when first transitioning to 0 volts at high-side input terminal 322, the bootstrap diode 346 is in a non-block state that allows the charging of the bootstrap capacitor 344.

The about 6 volts at the output 332 of the level shifter 102 gates the shaper transistor 328 of the shaper 326. This enables the shaper transistor 328, which pulls down the voltage at the shaper output 334 of the shaper 326 to the about 0 volts at the high-side return node 308. The about 0 volts at the shaper output 334 gates a first one of the latch transistors 338, thereby setting the first one of the latch transistors 338 to the OFF state. Since the first one of the latch transistors 338 is in the OFF state, the corresponding one of the latch resistors 340 pulls the latch output 342 towards the voltage at the high-side supply node 306. Further, since the latch output 342 is electrically coupled to high impedance inputs, the voltage at the latch output 342 is at the about 6 volts at the high-side supply node 306. These high impedance inputs include the input of the high-side gate driver 302 and the gate of a second one of the latch transistors 338.

The about 6 volts at the gate of the second one of the latch transistors 338 enables the second one of the latch transistors 338, which electrically couples the shaper output 334 to the low-side return node 308. Additionally, the about 6 volts at the input of the high-side gate driver 302 triggers the high-side gate driver 302 to output about 0 volts to a gate of the high-side power transistor 316, assuming the high-side gate driver 302 is inverting. In other embodiments, the high-side gate driver 302 is non-inverting. The about 0 volts at the output of the high-side gate driver 302, in turn, disables the high-side power transistor 316. Further, since the high-side power transistor 316 is disabled, the high-side power transistor 316 electrically separates the high-voltage supply terminal 320 from the high-side return node 308.

With specific reference to the circuit diagram 500B of FIG. 5B, the high-voltage supply terminal 320 is still biased at about 650 volts by a high-voltage power supply (not shown), and the low-side supply terminal 312 is still biased at about 6 volts by a low voltage power supply (not shown). However, in contrast with the circuit diagram 500B of FIG. 5B, the high-side input signal at the high-side input terminal 322 and the low-side input signal at the low-side input terminal 324 are at about 6 volts.

The about 6 volts at the low-side input terminal 324 triggers the low-side gate driver 304 to output about 0 volts to a gate of the low-side power transistor 318, assuming the low-side gate driver 304 is inverting. In other embodiments, the low-side gate driver 304 is non-inverting. The about 0 volts at the output of the low-side gate driver 304, in turn, disables the low-side power transistor 318. As a result, the high-side return node 308 and the low-side return terminal 314 are electrically separated by the low-side power transistor 318.

When first transitioning to about 6 volts at the high-side input terminal 322, the high-side power transistor 316 and the low-side power transistor 318 are in OFF states. As such, the high-side return node 308 is essentially floating, assuming the load (not shown) at the load terminal 348 has a high input impedance. Further, the voltage at the high-side supply node 306 is the about 6 volts across the bootstrap capacitor 344 plus the voltage at the high-side return node 308. Therefore, the voltage at the high-side supply node 306 is at least about 6 volts. Over time, the voltage at the high-side return node 308 tends to float upward, whereby the voltage at the high-side supply node 306 tends to float upward. Therefore, the voltage at the high-side supply node 306 tends to exceed the voltage at the low-side supply terminal 312. Further, the bootstrap diode 346 enters a blocking state that electrically separates the low-side supply terminal 312 from the high-side supply node 306.

The about 6 volts at the high-side input terminal 322 causes a cascade effect through the level shifter 102, the shaper 326, the latch 336, and the high-side gate driver 302 that eventually turns the high-side power transistor 316 to the ON state using the bootstrap capacitor 344 as a power supply. When the high-side power transistor 316 is turned to the ON state, the voltage at the high-side return node 308 is no longer floating and becomes about the same as the about 650 voltage at the high-voltage supply terminal 320. This, in turn, enables the load (not shown) electrically coupled form the load terminal 348 to the low-side return terminal 314. Additionally, when the high-side power transistor 316 is turned to the ON state, the voltage at the high-side supply node 306 becomes the voltage at the high-side return node 308 plus the voltage across the bootstrap capacitor 344. For example, the high-side supply node 306 becomes about 656 volts when the voltage at the high-side return node 308 is about 650 volts.

The cascade effect triggered by the about 6 volts at the high-side input terminal 322 begins by enabling the transistor 110 of the level shifter 102. As a result, static current may flow along a conductive path 504 extending from the high-side supply node 306 to the low-side return terminal 314. Further, the voltage at the output 332 of the level shifter 102 is pulled down by the pull-down resistor 112 towards the voltage at the low-side return terminal 314.

Since the output 332 of the level shifter 102 is electrically coupled to a gate of the shaper 326, which is a high impedance input, the level shifter 102 may be modeled as a voltage divider. Therefore, the voltage at the output 332 of the level shifter 102 may be equal to or about equal to $$\frac{R_{pd} + R_{on}}{R_{pd} + R_{on} + R_{pu}} V_{ps},$$

where $R_{pd}$ is the resistance of the pull-down resistor 112, $R_{on}$ is the ON resistance of the transistor 110, $R_{pu}$ is the resistance of the pull-up resistor 108, and $V_{ps}$ is the at least 6 volts at the high-side supply node 306. The ratio of the pull-up and pull-down resistors 108, 112 are selected so the voltage at the output 332 of the level shifter 102, relative to the high-side return node 308, is less than the threshold voltage of the shaper transistor 328. For example, where the voltage at the high-side supply node 306 and the high-side return node 308 are respectively 656 volts and 650 volts, the resistance ratio of the pull-up and pull-down resistors 108, 112 may be such that the voltage across the pull-up resistor 108 is about 6 volts and the voltage at the output 332 of the level shifter is about 650 volts.

Since the output 332 of the level shifter 102 is at a lesser voltage than the threshold voltage of the shaper transistor 328, the shaper transistor 328 is in the OFF state and the shaper output 334 of the shaper transistor 328 is pulled up towards the voltage at the high-side supply node 306. By pulling up the shaper output 334, the voltage at the shaper output 334 may, for example, be about 656 volts. The latch 336 latches the shaper output 334, and the latch output 342 controls the high-side gate driver 302. Further, the output of the high-side gate driver 302 controls the high-side power transistor 316. As in FIG. 5A, the latch 336 and the high-side gate driver 302 are assumed to be inverting, whereby the latch output 342 may, for example, be about 650 volts when the shaper output 334 is about 656 volts, and the output of the high-side gate driver 302 may be about 656 volts when the latch output 342 is about 650 volts.

While FIGS. 5A and 5B are used to describe operation of a gate driver circuit using embodiments of the gate driver circuit in FIG. 3A, it is to be understood that the description is generally applicable to embodiments of the gate driver circuit in any one of the FIGS. 3B-3F. Differences in the operation of the various embodiments of the gate driver circuit in FIGS. 3B-3F were emphasized while discussing the individual embodiments.

Figure 6:
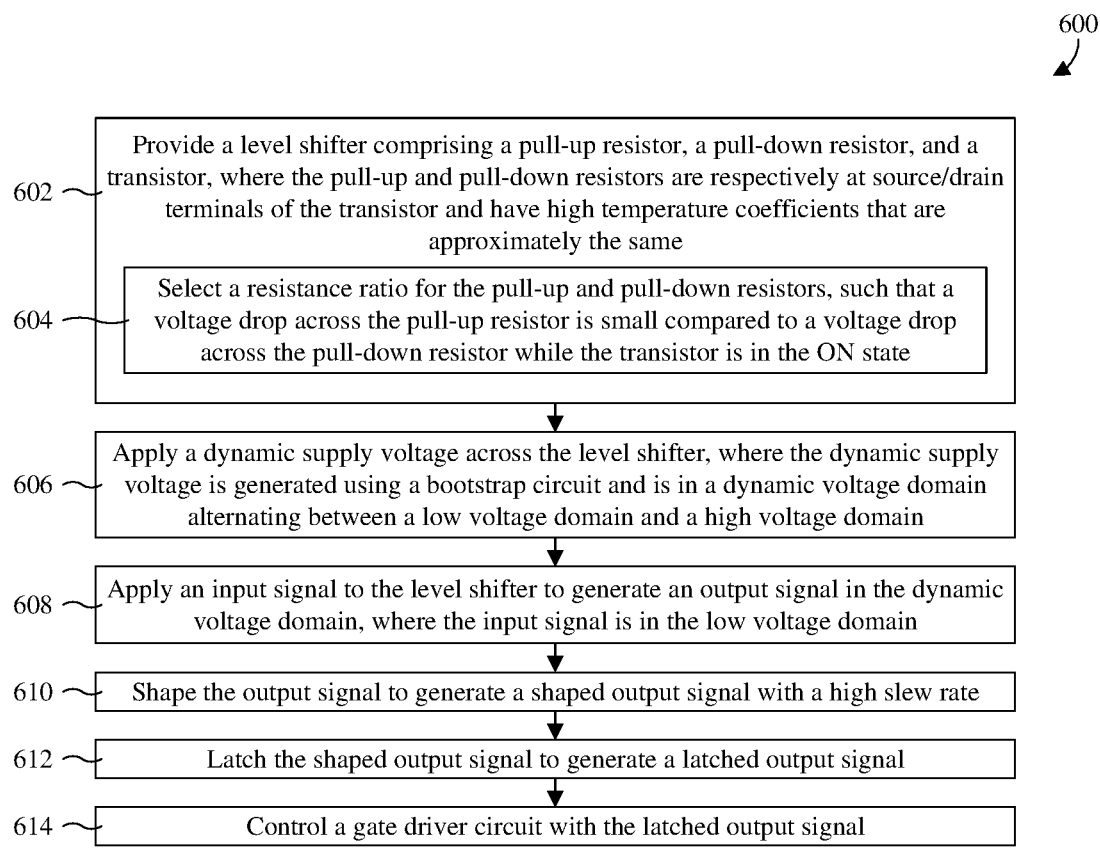
FIG. 6 illustrates a block diagram of some embodiments of a method of using a level shifter with temperature compensation.

With reference to FIG. 6, a block diagram 600 of some embodiments of a method of using the level shifter and the gate driver circuit of FIG. 3A is provided.

At 602, a level shifter comprising a pull-up resistor, a pull-down resistor, and a transistor is provided, where the pull-up and pull-down resistors are respectively at source/drain terminals of the transistor and have high temperature coefficients that are approximately the same. The level shifter may typically be modeled as a voltage divider in which the output voltage is controlled by the resistance ratio of the pull-up and pull-down resistors. Since the pull-up and pull-down resistors have high temperature coefficients that are approximately the same, temperature-induced resistance variations in the ratio largely cancel out and the ratio is minimally affected by temperature variations. As a result, the voltage output of the level shifter is not prone to large temperature-induced voltage swings.

At 604, the providing of the level shifter comprises selecting a resistance ratio for the pull-up and pull-down resistors, such that a voltage drop across the pull-up resistor is small compared to a voltage drop across the pull-down resistor while the transistor is in the ON state. As such, the resistance of the pull-down resistor is large compared to the resistance of the pull-up resistor. Resistance of the pull-down resistor may be large to reduce static current while the transistor is in the ON state. Resistance of the pull-up resistor may be small to reduce the RC time constant at the output of the level shifter, thereby allowing fast switching speeds at the output of the level shifter. Therefore, the combination of the pull-up and pull-down resistors allows fast switching at the output of the level shifter while also reducing static current.

At 606, a dynamic supply voltage is applied across the level shifter, where the dynamic supply voltage is generated using a bootstrap circuit and is in a dynamic voltage domain alternating between a low voltage domain and a high voltage domain. The low voltage domain may, for example, be about 0 volts to about 6 volts, whereas the high voltage domain may, for example, be about 650 volts to about 656 volts. Other voltages are, however, amenable. The bootstrap circuit may, for example, be used in conjunction with a high-side gate driver and a low-side gate driver as illustrated and described with regard to FIGS. 5A and 5B.

At 608, an input signal is applied to the level shifter to generate an output signal in the dynamic voltage domain, where the input signal is in the low voltage domain.

At 610, the output signal is shaped to generate a shaped output signal with a fast slew rate. The shaped output signal may, for example, be in the dynamic voltage domain.

At 612, the shaped output signal is latched to generate a latched output signal. In some embodiments, the latching is done by a flip flop to allow for pulsed or AC coupled inputs. This, in turn, reduces or eliminates static current at the level shifter. The latched output signal may, for example, be in the dynamic voltage domain.

At 614, a gate driver circuit is controlled with the latched output signal.

While the block diagram 600 of FIG. 600 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a level shifter circuit including: a transistor; a first resistor electrically coupled from a first source/drain of the transistor to a power supply node; and a second resistor electrically coupled from a second source/drain of the transistor to a reference node; wherein the first and second resistors have substantially the same temperature coefficients and include group III-V semiconductor material. In some embodiments, the temperature coefficients of the first and second resistors are high, such that the temperature coefficients change by more than, for example, 1% per degree Celsius change in temperature. In some embodiments the transistor is a HEMT. In some embodiments, the first and second resistor are 2DEG resistors. In some embodiments, the second resistor has a larger resistance than the first resistor. In some embodiments, the level shifter circuit further includes a gate driver including an input electrically coupled to a common node at which the first resistor and the first source/drain are electrically coupled.

In some embodiments, the present application provides a gate driver circuit including: a level shifter including a transistor, a first resistor, and a second resistor, wherein the first resistor is electrically coupled from a first source/drain of the transistor to a dynamic power supply node, and wherein the second resistor is electrically coupled from a second source/drain of the transistor to a reference node; and a high-side gate driver including power terminals electrically coupled respectively to the dynamic supply node and a dynamic return node, wherein the high-side gate driver is configured to be controlled by an output of the level shifter. In some embodiments, the transistor, the first resistor, and the second resistor each include a portion of a group III-V heterojunction structure. In some embodiments, the gate driver circuit further includes a bootstrap circuit including a bootstrap switch and a bootstrap capacitor, wherein the bootstrap capacitor is electrically coupled from the dynamic supply node to the dynamic return node, and wherein the bootstrap switch is electrically coupled to the dynamic supply node. In some embodiments, the bootstrap switch includes a bootstrap diode, wherein a cathode of the bootstrap diode is electrically coupled to the dynamic supply node. In some embodiments, the bootstrap switch includes a bootstrap transistor, wherein a source of the bootstrap transistor is electrically coupled to the dynamic supply node. In some embodiments, the gate driver circuit further includes a low-side gate driver including power terminals electrically coupled respectively to a low-side supply node and the reference node. In some embodiments, the gate driver circuit further includes: a first power transistor including a first source/drain electrically coupled to a high voltage node, a second source/drain electrically coupled to the dynamic return node, and a gate electrically coupled to an output of the high-side gate driver; and a second power transistor including a first source/drain electrically coupled to the dynamic return node, a second source/drain electrically coupled to the reference node, and a gate electrically coupled to an output of the low-side gate driver. In some embodiments, the gate driver circuit further includes: a shaper between the output of the level shifter and the gate driver, wherein an input of the shaper is electrically coupled to the output of the level shifter; and a latch between the shaper and the gate driver, wherein an input of the latch is electrically coupled to an output of the shaper, and wherein an output of the latch is electrically coupled to an input of the high-side gate driver. In some embodiments, the gate driver circuit further includes: a second level shifter; and a flip flop electrically coupled to an input of the high-side gate driver, wherein the flip flop is configured to be set by the output of the level shifter, and wherein the flip flop is configured to be reset by an output of the second level shifter.

In some embodiments, the present application provides a method including: providing a level shifter including a first resistor, a second resistor, and a transistor, wherein the first and second resistors are respectively at source/drain terminals of the transistor; applying a dynamic supply voltage across the level shifter, from a terminal of the first resistor to a terminal of the second resistor, wherein the dynamic supply voltage is generated using a bootstrap circuit and is in a dynamic voltage domain that alternates between a low voltage domain and a high voltage domain; applying an input signal to a gate of transistor, wherein the input signal is in the low voltage domain; and generating an output signal from the input signal, wherein the output signal is generated at a node common to the first resistor and the transistor, and wherein the output signal is in the dynamic voltage domain. In some embodiments, the first and second resistors are 2DEG resistors and the transistor is a n-type HEMT. In some embodiments, the method further includes: reshaping the output signal into a shaped signal with a faster slew rate than the output signal; and controlling a high-side gate driver using the shaped signal. In some embodiments, the method further includes latching the shaped signal by a latch, wherein the high-side gate driver is controlled by a latched signal of the latch. In some embodiments, the dynamic voltage is generated using a bootstrap capacitor and the method further includes: charging the bootstrap capacitor while the dynamic voltage domain is at the low voltage domain; and discharging the bootstrap capacitor while the dynamic voltage domain is at the high voltage domain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a level shifter comprising a first resistor, a second resistor, and a transistor, wherein the first resistor is electrically coupled from a first terminal to a first source/drain of the transistor, and wherein the second resistor is electrically coupled from a second terminal to a second source/drain of the transistor;
applying a supply voltage across the level shifter, from the first terminal to the second terminal; and
applying an input voltage to a gate of the transistor to turn the transistor to an ON state;
wherein a voltage drop across the first resistor has a magnitude closer to a magnitude of the input voltage than a magnitude of the supply voltage while the input and supply voltages are applied.

2. The method according to claim 1, further comprising:
applying a second supply voltage across the level shifter, from the first terminal to the second terminal; and
applying a second input voltage to the gate to turn the transistor to an OFF state;
wherein the magnitude of the voltage drop is closer to a magnitude of the second supply voltage than a magnitude of the second input voltage while the second input and supply voltages are applied.

3. The method according to claim 2, further comprising:
alternatingly changing between the supply voltage and the second supply voltage at the first terminal, wherein the first terminal changes to the supply voltage in response to the input voltage being applied to the gate, and wherein the first terminal changes to the second supply voltage in response to the second input voltage being applied to the gate.

4. The method according to claim 2, further comprising:
providing a high-side gate driver having an input electrically coupled to an output of the level shifter, which is at the first source/drain;
outputting an output voltage at the output while the input and supply voltages are applied, wherein the high-side gate driver is in a first state while outputting the output voltage; and
outputting a second output voltage at the output while the second input and supply voltages are applied, wherein the high-side gate driver is in a second state while outputting the second output voltage;
wherein a difference between the second supply voltage and the second output voltage is less than a difference between the supply voltage and the output voltage.

5. The method according to claim 1, wherein the magnitude of the voltage drop is about the same as the magnitude of the input voltage while the input and supply voltages are applied.

6. The method according to claim 1, further comprising:
outputting an output voltage at an output of the level shifter while the input and supply voltages are applied, wherein the output voltage is hundreds of volts or more, and wherein the input voltage is less than or equal to 6 volts.

7. A method comprising:
providing a level shifter comprising a transistor, a first resistor, and a second resistor, wherein the first resistor is electrically coupled from a first source/drain of the transistor to a dynamic power supply node, and wherein the second resistor is electrically coupled from a second source/drain of the transistor to a reference node; and
alternating a voltage at the dynamic power supply node between a first supply value and a second supply value;
wherein the voltage has the first supply value while the transistor is in an ON state and the second supply value while the transistor is in an OFF state, and wherein a voltage drop across the first resistor is less than or equal to the second supply value while the transistor is in the ON state.

8. The method according to claim 7, further comprising:
generating an output signal, wherein the output signal is generated at a node common to the first resistor and the transistor, and wherein the output signal alternates between a first output voltage and a second output voltage; and
controlling a high-side gate driver based on the output signal;
wherein the node is directly electrically coupled to an input of the high-side gate driver.

9. The method according to claim 7, further comprising:
generating an output signal, wherein the output signal is generated at a node common to the first resistor and the transistor, and wherein the output signal alternates between a first output voltage and a second output voltage;
reshaping the output signal into a shaped signal with a faster slew rate than the output signal, wherein the reshaping is performed by a shaper circuit directly electrically coupled to the node; and
controlling a high-side gate driver based on the shaped signal.

10. The method according to claim 9, wherein the shaper circuit is directly electrically coupled to the high-side gate driver, and wherein the shaper circuit consists essentially of a shaper transistor and a shaper resistor.

11. The method according to claim 9, further comprising:
latching the shaped signal to generate a latched signal, wherein the high-side gate driver is controlled by the latched signal, and wherein the latching is performed by a latch circuit directly electrically coupled to the shaper circuit and the high-side gate driver.

12. The method according to claim 7, wherein the first supply value is hundreds of volts or more, whereas the second supply value is less than or equal to 6 volts.

13. An integrated circuit (IC) chip comprising:
a level shifter comprising a transistor, a first resistor, and a second resistor, wherein the first resistor is electrically coupled from a first source/drain of the transistor to a first terminal, and wherein the second resistor is electrically coupled from a second source/drain of the transistor to a second terminal; and
a high-side gate driver having a power terminal electrically coupled to the first terminal, and further having an input electrically coupled to an output of the level shifter, which is at the first source/drain;
wherein a resistance of the second resistor is greater than a resistance of the first resistor.

14. The IC chip according to claim 13, wherein the transistor has an ON resistance, wherein a sum of the ON resistance and the resistance of the second resistor is orders of magnitude larger than the resistance of the first resistor.

15. The IC chip according to claim 13, wherein a body of the transistor is electrically shorted to the second terminal.

16. The IC chip according to claim 13, wherein the input of the high-side gate driver is directly electrically coupled to the output of the level shifter.

17. The IC chip according to claim 13, further comprising:
a shaper directly electrically coupled to the output of the level shifter or the input of the high-side gate driver, wherein the shaper consists essentially of a shaper transistor and a shaper resistor electrically coupled at a common node.

18. The IC chip according to claim 17, wherein the shaper is directly electrically coupled to both the input of the high-side gate driver and the output of the level shifter.

19. The IC chip according to claim 17, further comprising:
a latch between and electrically coupled to the shaper and the input of the high-side gate driver, wherein the latch is directly electrically coupled to the shaper, and wherein the latch comprises a pair of cross-coupled latch transistors.

20. The IC chip according to claim 13, further comprising:
a semiconductor substrate on which the transistor, the first resistor, and the second resistor are, wherein the transistor is a high-electron-mobility transistor.

* * * * *